(12) United States Patent
Draxelmayr

(10) Patent No.: US 6,404,242 B2
(45) Date of Patent: Jun. 11, 2002

(54) COMPARATOR CIRCUIT

(75) Inventor: Dieter Draxelmayr, Villach (AT)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/925,167

(22) Filed: Aug. 8, 2001

Related U.S. Application Data

(63) Continuation of application No. PCT/DE00/00306, filed on Feb. 1, 2000.

(51) Int. Cl.[7] ............................................. H03K 5/153
(52) U.S. Cl. ........................................... 327/76; 327/77
(58) Field of Search ............................ 327/68, 69, 70, 327/74, 76, 77, 205, 206

(56) References Cited

U.S. PATENT DOCUMENTS

| | | | |
|---|---|---|---|
| 3,976,949 A | 8/1976 | Hepworth et al. | 328/206 |
| 4,418,332 A | 11/1983 | Mefford | 327/69 |
| 4,529,892 A * | 7/1985 | Reilly et al. | 327/75 |
| 5,394,023 A | 2/1995 | Gleim et al. | 327/73 |
| 5,418,409 A * | 5/1995 | Kuhn | 327/205 |
| 5,436,582 A | 7/1995 | Ikeda | 327/65 |
| 5,539,340 A * | 7/1996 | Van Leeuwen et al. | 327/52 |
| 5,570,052 A * | 10/1996 | Fonderie et al. | 327/205 |

FOREIGN PATENT DOCUMENTS

| | | | | |
|---|---|---|---|---|
| DE | 25 22 463 | | 11/1976 | H03K/17/30 |
| DE | 3837821 | | 5/1990 | H03K/17/30 |
| DE | 42 15 423 | A1 | 11/1993 | H03K/3/205 |
| EP | 0 373 693 | | 6/1990 | H03K/17/687 |
| GB | 1 523 883 | | 9/1978 | H03K/5/153 |
| GB | 2 121 632 | | 12/1983 | H03K/17/30 |

* cited by examiner

*Primary Examiner*—Toan Tran
(74) *Attorney, Agent, or Firm*—Laurence A. Greenberg; Werner H. Stemer; Gregory L. Mayback

(57) ABSTRACT

A comparator circuit is described and contains a comparator, which is provided with an operating point. A montioring circuit suppresses undesired signal bouncing at the output. The bouncing is produced by interferences of the input signal. The monitoring circuit ensures that the circuit output is locked from being switched back to another logical level after switching until the input signal has reached a second threshold value that is higher than the operating point.

7 Claims, 3 Drawing Sheets

COMPARATOR CIRCUIT

CROSS-REFERENCE TO RELATED APPLICATION

This application is a continuation of copending International Application No. PCT/DE00/00306, filed Feb. 1, 2000, which designated the United States.

BACKGROUND OF THE INVENTION

Field of the Invention

The invention relates to a comparator circuit. Comparators are used in order to map an input variable, for example an input voltage, onto a logic state. If the input voltage is below the threshold value of the comparator, then the output voltage from the comparator is at the first logic level, for example low (L), and if the input voltage is above the threshold value, then the output voltage is at the second logic level, for example high (H).

A quality criterion for comparators is the accuracy with which a specific, defined switching threshold is carried out. In a sensor system, or else in comparators, which are used in peripheral circuit parts, one problem, which often arises is that the input signal of the comparator is subject to interference or noise. This leads to the comparator switching backward and forward in a rapid sequence between the logic levels L and H. The signal bouncing is undesirable. Bouncing must be avoided, particularly when the aim, for example, is to count events or to generate a clock on the basis of an external signal.

One known remedial measure is to provide the comparator with hysteresis. In this case, the threshold above which the input signal must rise is higher for switching from L to H than for switching back from H to L. If the interval between the switching thresholds is made greater than the amplitude of the interference to be expected, then unambiguous signal evaluation is feasible. However, the interference immunity is gained at the expense of switching threshold accuracy, since it is split between two values. If the switching thresholds are chosen such that the upper and the lower value are each symmetrical with respect to the actually desired switching threshold, then this admittedly results in the minimum discrepancies overall, but there is now no longer any switching threshold precisely where it actually should be. This is irrelevant if one just wishes to count events. However, if accurate position or time determination is also intended to be carried out, for example in the sensor system, this response has a disturbing effect. For example, for sensors, which have to evaluate an approximately sinusoidal signal, for example gear wheel sensors, it is advantageous for reasons of accuracy to switch at the signal zero crossing, while one would have to switch in the vicinity of the signal peak, for interference immunity reasons.

SUMMARY OF THE INVENTION

It is accordingly an object of the invention to provide a comparator circuit that overcomes the above-mentioned disadvantages of the prior art devices of this general type, which has an accurate, largely hysteresis-free switching threshold, but which also offers interference immunity, by which disturbing bouncing is avoided.

With the foregoing and other objects in view there is provided, in accordance with the invention, a comparator circuit. The comparator circuit contains an input for receiving an input signal, an output terminal outputting an output signal, and a first comparator connected to the input and receiving the input signal. When the input signal exceeds a threshold value $T_1$, the first comparator generates a first output signal switching from a first logic signal to a second logic signal, in which case a switching of the output signal from the first logic signal to the second logic signal can be initiated only by the first comparator switching from the first logic signal to the second logic signal. A monitoring circuit is connected between the input and the output terminal. The monitoring circuit contains a second comparator connected to the input and has a switching hysteresis with a switching-on threshold $T_2$ and a switching-off threshold $T_3$, where $T_2 > T_3$. The second comparator and the first comparator each have an output. An output circuit and a logic circuit are provided. The logic circuit is connected to the output circuit, to the output of the first comparator, and to the output of the second comparator. The logic circuit links the output of the first comparator and the second comparator to the output circuit in such a manner that, when the input signal exceeds the threshold value $T_1$, the output circuit emits the second logic signal and then remains inhibited against returning to the first logic signal until the input signal has once again fallen below the threshold value $T_1$ after exceeding the switching-on threshold value $T_2$. A reset circuit is connected to the output circuit and the logic circuit. The reset circuit is able to reset the output circuit to a quiescent state irrespective of a state of the first comparator and the second comparator, and in the quiescent state the output signal at the output terminal is at the first logic signal, and the output circuit maintains its present state until the first comparator and the second comparator output signals are the first logic signal.

According to the invention, the undesirable bouncing is avoided in that, after switching from the first to the second logic level, the circuit output remains inhibited against switching back until the input signal has reached a second threshold value, which is higher than the switching threshold of the first comparator. The switching threshold of the circuit output is governed by the switching threshold of the comparator, but the switching times are dependent on whether and when the input signal reaches the second threshold value.

According to one refinement of the invention, the monitoring circuit contains a further comparator, which has hysteresis and whose input is connected to the circuit input, and a logic circuit. The monitoring circuit is configured such that the comparator can emit a signal only when the input signal supplied to it is sufficiently large to switch the further comparator that has hysteresis, as well. If the input signal is too low, the output signal is not switched. Although the comparator does not act directly on the output itself, it must, however, enable the circuit to allow the comparator to switch back again and to produce a new output flank.

In one particularly advantageous refinement of the invention, a reset circuit is provided, by which the comparator circuit can be switched to a defined initial state, which is independent of the switching states of the comparators when the reset signal is present. The purpose of the reset circuit is that the very first switching (the very first output flank or edge) of the comparator is not defined by a reset event or by the reset end, but occurs precisely at the time at which the input signal would lead to switching of the comparator. The reset signal changes the output signal from the comparator circuit to the reset state, and locks the comparator output circuit. Enabling does not take place until the time when the internal comparator output matches the reset state, which is present at the output. This ensures that the next output flank at the output of the comparator circuit is also related to switching of the comparator.

A further advantage of the reset circuit is that a defined output situation is reached, in which, for example, the output signals from the comparators assume the level; this has an advantageous effect on the power consumption of the circuit.

In accordance with an added feature of the invention, the output circuit is a flip-flop with a set input, a reset input and an output being the output terminal.

In accordance with an additional feature of the invention, the logic circuit has a first AND gate, a second AND gate, a first NOT gate with an output, and a second NOT gate with an output. The first AND gate has a first input connected to the output of the first comparator and a second input connected to the output of the second NOT gate. The second NOT gate has an input connected to the output of the second comparator. The second AND gate has a first input connected to the output of the first NOT gate and a second input connected to the output of the second comparator. The first NOT gate has an input connected to the output of the first comparator.

In accordance with a further feature of the invention, the flip-flop includes a first NOR gate having an output and inputs and a second NOR gate having an output and inputs. The output of the first NOR gate is connected to one of the inputs of the second NOR gate, and the output of the second NOR gate connected to one of the inputs of the first NOR gate.

In accordance with another feature of the invention, the reset circuit includes a third NOT gate having an input and an output; an input connection connected to the input of the third NOT gate; and a third AND gate having a first input connected to the output of the second NOR gate of the flip-flop, a second input connected to the output of the third NOT gate, and an output connected to one of the inputs of the first NOR gate of the flip-flop. A further flip-flop is provided and has a set input, a reset input connected to the input connection for receiving a reset signal, and an output connected to a third input of the first AND gate and to a third input of the second AND gate. An exclusive-OR gate is provided and has an output connected to the set input of the further flip-flop, a first input connected to the output of the first NOT gate and to the second input of the second AND gate, and a second input connected to the output of the third AND gate.

In accordance with a further added feature of the invention, the threshold value $T_1$, the switch-on threshold $T_2$ and the switch-off threshold $T_3$ are chosen such that $T_3 < T_1 < T_2$.

In accordance with a concomitant feature of the invention, the first logic signal is low (logic 0), and the second logic signal is high (logic 1).

Other features which are considered as characteristic for the invention are set forth in the appended claims.

Although the invention is illustrated and described herein as embodied in a comparator circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
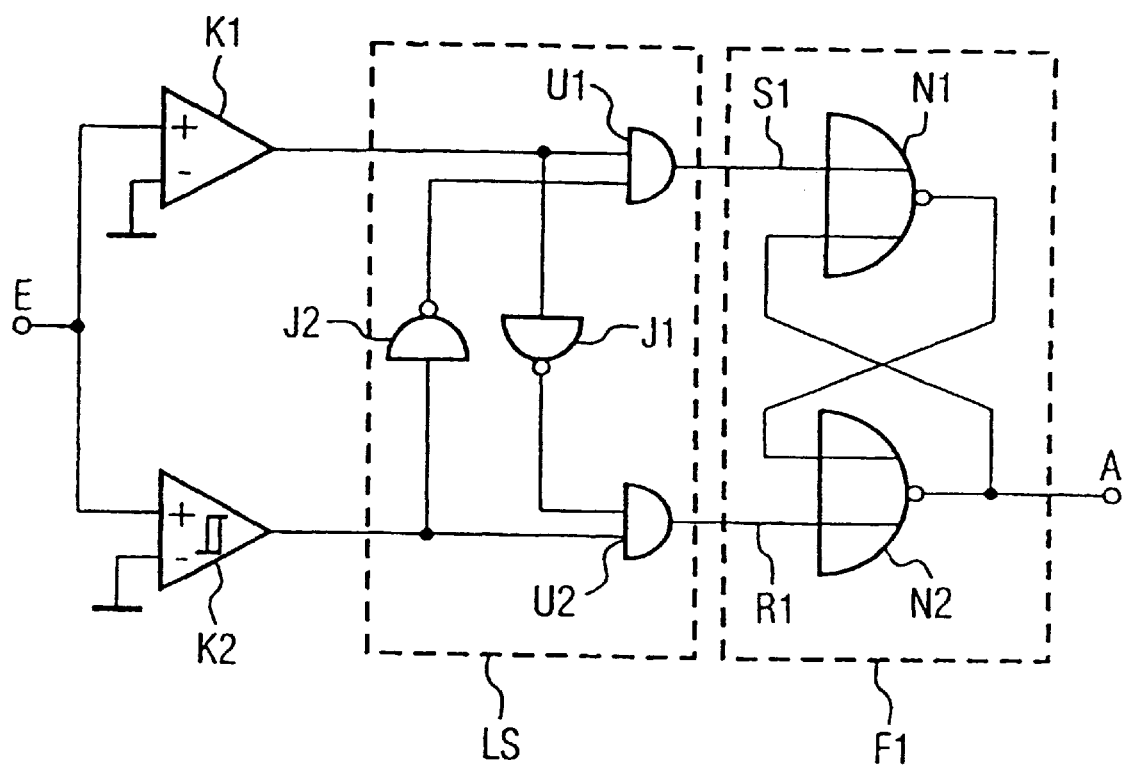
FIG. 1 is a circuit diagram of a first embodiment of a comparator circuit according to the invention.

In all the figures of the drawing, sub-features and integral parts that correspond to one another bear the same reference symbol in each case. Referring now to the figures of the drawing in detail and first, particularly, to FIG. 1 thereof, there is shown a first exemplary embodiment of the invention. An input is connected to inputs of two comparators K1, K2 and receives an input signal E. The comparator K1 essentially has no hysteresis, and it switches from L to H when the input signal E exceeds a threshold $T_1$ (see FIG. 2). The comparator K2 has hysteresis. The comparator K2 switches from L to H when the input signal E exceeds a threshold $T_2$, and from H to L when the input signal E falls below $T_3$. The output signals from the comparators K1, K2 are supplied to a logic circuit LS, which itself has two outputs which are supplied to an output circuit F1. The output circuit F1 is a flip-flop containing two NOR gates N1, N2, and whose signal level at an output A is L in the quiescent state. The logic circuit LS has two AND gates U1, U2. An output of the first AND gate U1 is connected to a set input S1 of the flip-flop F1, and an output of the second AND gate U2 is connected to a reset input R1 of the flip-flop F1. The output of the comparator K1 is connected to a first input of the AND gate U1, and, via a first NOT (inverter) gate I1, to the first input of the AND gate U2. The output of the comparator K2 is connected to the second input of a second AND gate U2, and via a second NOT (inverter) gate I2 to the second input of the first AND gate U1.

The initial state of the circuit is assumed to be defined by the input signal being E=0. In this case, the output signal from the comparators K1 and K2 is in each case L. The signal L is thus present at the first input of the AND gate U1 and, as a consequence of the inversion by the NOT gate 12, the signal H is present at its second input. As a consequence of the inversion by the NOT gate I1, a value H is present at the first input of the second AND gate U2, and the output signal from the comparator K2, which assumes the value L, is present at the second input. In consequence, the signal L is present both at the set input S1 of the flip-flop F1 and at its reset input R1, and the output signal A from the flip-flop F1 is likewise L.

Figure 2:
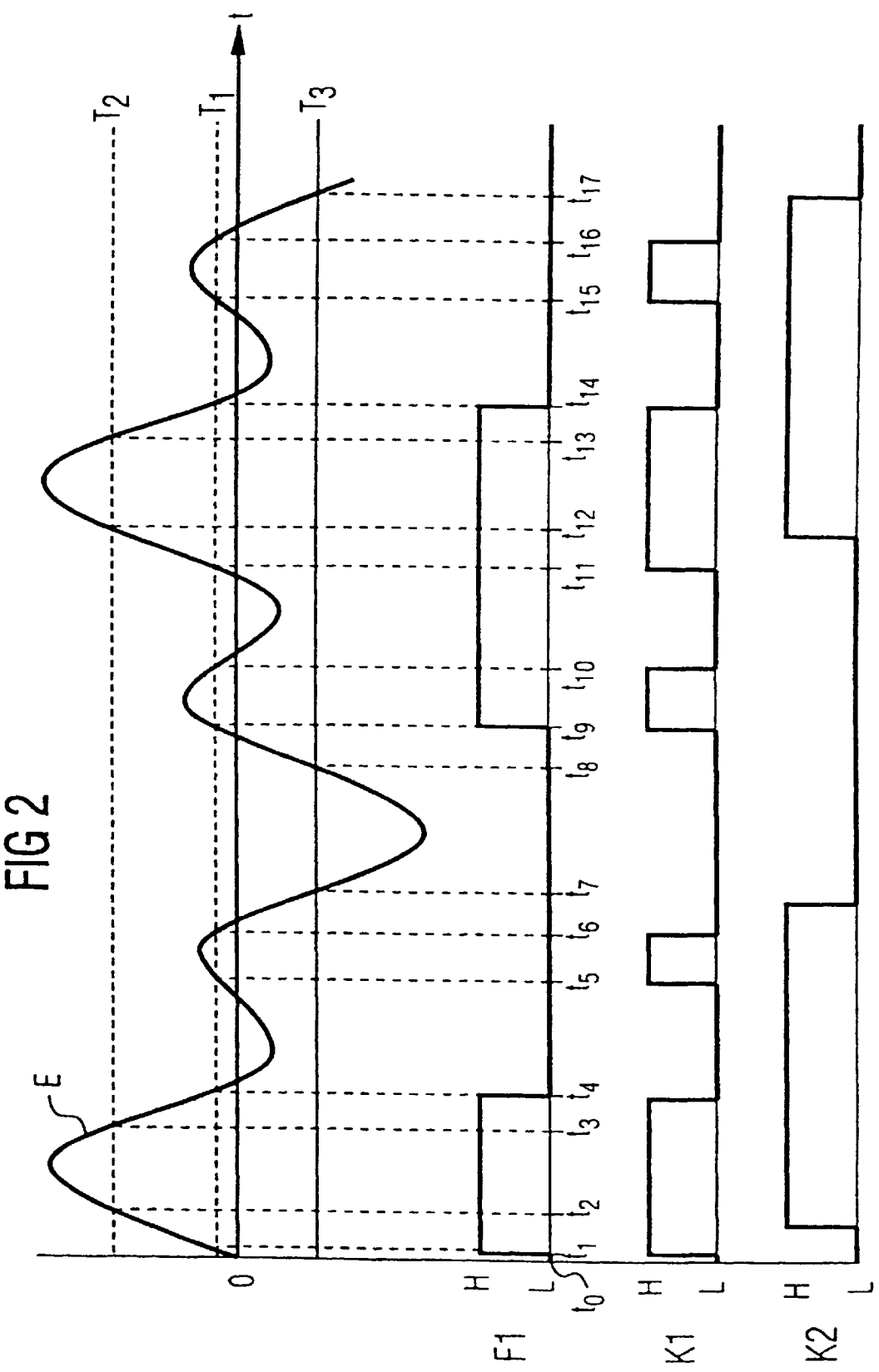
FIG. 2 is a timing diagram of an input signal and of switching processes initiated by the input signal.

FIG. 2 shows the profile of the input signal E, schematically. In the diagram, the line $T_1$ denotes the switching threshold of the comparator K1, the line $T_2$ the switching-on threshold and $T_3$ the switching-off threshold of the comparator K2.

As shown in FIG. 2, the input signal E rises from the value 0 to the threshold value $T_1$ of the comparator K1, which it reaches at a time $t_1$. The output signal from K1 thus becomes H at the time $t_1$. In consequence, the signal H is present at both inputs of the AND gate U1 at the time $t_1$, and the output signal from U1 likewise changes to H. Since the output signal from the AND gate U1 is supplied to the set input S1 of the flip-flop F1, the flip-flop F1 is set, and its output assumes the value H at the time $t_1$. Since the input signal E is still below the switching-on threshold $T_2$ of the comparator K2, its output signal remains at L at the time $t_1$.

The signal E rises further and reaches the switching-on threshold value $T_2$ of the comparator K2 at a time $t_2$. The output of the comparator K2 thus switches to H. As a consequence of the inversion by the NOT gate I2, the second input of the first AND gate U1 thus changes to L, so that the output signal from the AND gate U1 likewise falls to L. The output signal H from the comparator K1 is inverted by the NOT gate I1, so that the signal L is present at the first input of the AND gate U2. In consequence, the output signal from the second AND gate remains at L, and the output signal from the flip-flop F1 remains unchanged at the value H.

At a time $t_3$, the input signal E falls below the threshold value $T_2$. Since, owing to its hysteresis, the output of the comparator K2 does not fall back to L until the input signal E falls below the lower threshold value $T_3$, nothing changes in the switching states of the comparators K1, K2 at the time $t_3$, and the output A of the flip-flop F1 remains at H.

The input signal E falls below the threshold value $T_1$, of the comparator K1 at a time $t_4$, and its output signal changes back to L. However, the output signal from the comparator K2 remains at H, since the input signal E has not yet fallen below the threshold value $T_3$. In consequence, the signal L is present at each of the inputs of the first AND gate U1, and the signal H is present at each of the two inputs of the second AND gate U2. The output signal from the AND gate U2 is thus reset to H at the time $t_4$, and the flip-flop F1 is reset such that its output changes back from H to L. The input signal E once again reaches the threshold value $T_1$ of the comparator K1 at the time $t_5$, so that its output signal changes to H. The inversion by the first NOT gate I1 results in the first input of the second AND gate U2 being set to the value L. The output of the second AND gate U2 thus likewise remains at L. Since the inversion of the output signal from the comparator K2 by the NOT gate I2 also results in the second input of the first AND gate U1 being at L, the signal level which is present at the set input S1 is also L. The flip-flop F1 is thus locked in the state, which it assumed at the time $t_4$, and its output signal remains L. At a time $t_6$, the input signal E once again falls below the level $T_1$, so that the output signal from the comparator K1 becomes L once again. The signal L is thus present at both inputs of the first AND gate U1, and its output is likewise L. The inversion by the NOT gate I1 then results in the value H being present at both inputs of the second AND gate U2, so that the signal H appears at the output of the second AND gate U2, and the flip-flop F1 is reset. However, since its output had previously assumed the level L, the output signal A remains unchanged. The input signal E falls below the switching-off threshold value $T_3$ of the comparator K2 at a time $t_7$. The output signal from the comparator K2 thus changes back to L. In this state, both comparators K1, K2 produce the output signal L and, in consequence, the output signals from the two AND gates U1 and U2 are both L. The output of the flip-flop F1 thus remains unchanged at L. At a time $t_8$, the input signal E once again reaches the switching-off threshold value $T_1$ of the comparator K2. However, since this does not switch from L to H at $T_3$, but not until $T_2$, and the input signal likewise results in the comparator K1 output being L, no change in the switching state occurs at time $t_8$. The input signal E once again reaches the switching-on threshold $T_1$ of the comparator K1 at a time $t_9$, and its output signal in consequence changes from L to H. At this time, the output signal from the comparator K2 is L. This is inverted by the second NOT gate I2, so that the signal H is present at both inputs of the first AND gate U1 at the time $t_9$. The output signal from the AND gate U1 thus changes to H at the time $t_9$, which results in the flip-flop F1 being set, and its output A changing from L to H. The input signal E once again falls below the threshold value $T_1$ of the comparator K1 at the time $t_{10}$, so that its output signal changes from H to L. In consequence, the output of the first AND gate U1 falls from H to L. The inversion of the output signal from the comparator K1 by the NOT gate I1 results in the signal H being present at the first input of the second AND gate U2, and the output signal from the comparator K2, which is L, being present at the second input. The output signal from the AND gate U2 is thus L, and the state of the flip-flop F1 remains unchanged at the value H. The input signal E once again reaches the switching threshold $T_1$ of the first comparator K1 at the time $t_{11}$, and its output signal thus becomes H. Since the output signal from the comparator K2 continues to remain at L, the output signal from the first AND gate U1 becomes H, and the output signal from the second AND gate U2 remains at L. The flip-flop F1 is thus set. However, since the output signal had already assumed the value H at $t_9$, the output level of the flip-flop F1 remains unchanged.

The switching processes which take place at the times $t_{12}$ to $t_{17}$ correspond to those at the times $t_2$ to $t_7$ and therefore do not need to be explained once again.

It can be seen from the illustration in FIG. 2 that the flip-flop F1 is set when the threshold value $T_1$ of the comparator K1 is exceeded, and is not reset until the higher, upper threshold value $T_2$ has been exceeded by the comparator K2 with hysteresis. If the threshold value $T_2$ is not reached, the output of the comparator K2 never reaches the value H and, in consequence, the reset input R1 of the flip-flop F1 cannot assume the value H required for resetting.

Figure 3:
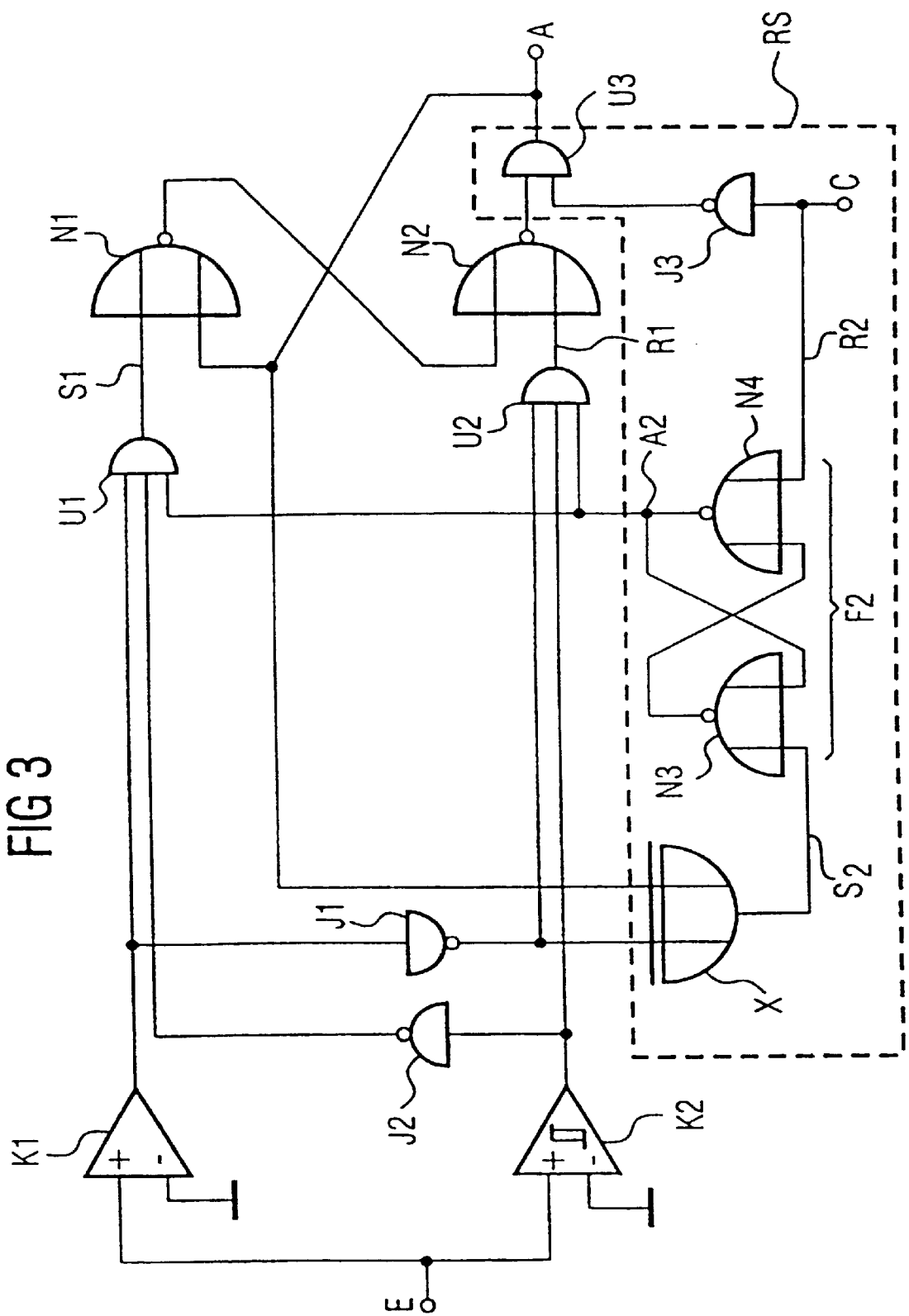
FIG. 3 is a circuit diagram of a second embodiment, in which the comparator circuit is provided with a reset circuit.

FIG. 3 shows a further exemplary embodiment of the comparator circuit according to the invention, in which a reset circuit RS is provided. The reset circuit RS contains a third AND gate U3, whose first input is connected to the output of the second NOR gate N2 in the flip-flop F1. However, in contrast to FIG. 1, the second input of the first NOR gate N1 is no longer directly connected to the output of the second NOR gate N2, but to the output of the third AND gate U3. The second input of the third AND gate U3 is connected via a third NOT gate I3 to a reset input connection C. When the signal L is present at the reset input connection C, then the inversion by the NOT gate I3 results in the input signal at the second input of the AND gate U3 assuming the value H. In this situation, the output signal A depends only on whether the second NOR gate N2 in the flip-flop F1 is producing the value H or L at its output. Therefore, when the reset input C is at L, the flip-flop F1, to which the third AND gate U3 has been added, operates in precisely the same way as the flip-flop F1 in FIG. 1. If the signal H is applied to the reset input C, the input signal at the second input of U3 becomes L and, in consequence, the output A of the circuit is changed to L.

The reset input connection C is also connected to the reset input R2 of a second flip-flop F2, which contains NOR gates N3, N4.

The AND gates U1, U2 each have three inputs. The first two inputs are connected in precisely the same way as in the exemplary embodiment shown in FIG. 1. The third inputs are both connected to the output A2 of the second flip-flop F2. A set input S2 of the flip-flop F2 is connected to an output of an exclusive-OR gate X. One input of the exclusive-OR gate is connected to the output of the NOT gate I1, and to the first input of the second AND gate U2. The other input of the exclusive-OR gate X is connected to the output A of the circuit.

In order to describe the method of operation of the reset circuit, the following text assumes the situation in which the output signal from the comparator K1 is H, and the output signal from the comparator K2 is L. This would correspond, for example, to the interval between $t_9$ and $t_{10}$ in FIG. 2.

If the signal H is applied to the reset input connection C in this situation, the output A is reset to the signal L. The signal H is present at the reset input of the flip-flop F2. The output signal from the comparator K1, inverted by I1, that is to say the signal L, is present at the first input of the exclusive-OR gate X. The signal L is likewise present at the second input of the exclusive-OR gate X. In consequence, the output signal from the exclusive-OR gate X is likewise L. This results in the flip-flop F2 being set to the basic state. The output A2 of the flip-flop F2 becomes L. In consequence, the AND gates U1 and U2 each block the output signals from the comparators K1, K2.

If the reset signal now becomes L, then the output A remains at the value L, and the flip-flop F1 remains in the initial state. The flip-flop F2 does not change its state either, and its output A2 remains at L. Thus, as before, the AND gates U1 and U2 block the output signals from the comparators K1, K2.

If the output signal from the comparator K1 then assumes the value L owing to a change in the input signal, that is to say the situation, which corresponds to the initial state, then one input of the exclusive-OR gate X becomes H, and the other remains at L. In a corresponding way, the output signal from the exclusive-OR gate X assumes the value H, so that H is applied to the set input of the flip-flop F2. The flip-flop F2 is thus set, that is to say its output becomes H. In consequence, the two third inputs of the AND gates U1, U2 are each set to H, so that the blocking of the signals from the comparators K1, K2, which was previously carried out by the reset circuit, is cancelled once again.

The exemplary embodiments described above can also be implemented using inverted logic, in which the logic signals L and H are interchanged with one another.

I claim:

1. A comparator circuit, comprising:
    an input for receiving an input signal;
    an output terminal outputting an output signal;
    a first comparator connected to said input and receiving the input signal, when the input signal exceeds a threshold value $T_1$, said first comparator generates a first output signal switching from a first logic signal to a second logic signal, in which case a switching of the output signal from the first logic signal to the second logic signal can be initiated only by said first comparator switching from the first logic signal to the second logic signal;
    a monitoring circuit connected between said input and said output terminal, said monitoring circuit, including:
    a second comparator connected to said input and has a switching hysteresis with a switching-on threshold $T_2$ and a switching-off threshold $T_3$, where $T_2>T_3$, said second comparator and said first comparator each have an output;
    an output circuit; and
    a logic circuit connected to said output circuit, to said output of said first comparator, and to said output of said second comparator, said logic circuit links said output of said first comparator and said second comparator to said output circuit in such a manner that, when the input signal exceeds the threshold value $T_1$, said output circuit emits the second logic signal and then remains inhibited against returning to the first logic signal until the input signal has once again fallen below the threshold value $T_1$, after exceeding the switching-on threshold value $T_2$; and
    a reset circuit connected to said output circuit and said logic circuit, said reset circuit able to reset said output circuit to a quiescent state irrespective of a state of said first comparator and said second comparator, and in the quiescent state the output signal at said output terminal is at the first logic signal, and the output circuit maintains its present state until said first comparator and said second comparator output signals being the first logic signal.

2. The comparator circuit according to claim 1, wherein said output circuit is a flip-flop with a set input, a reset input and an output being said output terminal.

3. The comparator circuit according to claim 2, wherein said logic circuit has a first AND gate, a second AND gate, a first NOT gate with an output, and a second NOT gate with an output, said first AND gate having a first input connected to said output of said first comparator and a second input connected to said output of said second NOT gate, said second NOT gate having an input connected to said output of said second comparator, said second AND gate having a first input connected to said output of said first NOT gate and a second input of said second AND gate connected to said output of said second comparator, said first NOT gate having an input connected to said output of said first comparator.

4. The comparator circuit according to claim 3, wherein said flip-flop includes a first NOR gate having an output and inputs and a second NOR gate having an output and inputs, said output of said first NOR gate connected to one of said inputs of said second NOR gate, said output of said second NOR gate connected to one of said inputs of said first NOR gate.

5. The comparator circuit according to claim 4, wherein said reset circuit includes:
    a third NOT gate having an input and an output;
    an input connection connected to said input of said third NOT gate;
    a third AND gate having a first input connected to said output of said second NOR gate of said flip-flop, a second input connected to said output of said third NOT gate, and an output connected to one of said inputs of said first NOR gate of said flip-flop;
    a further flip-flop having a set input, a reset input connected to said input connection for receiving a reset signal, and an output connected to a third input of said first AND gate and to a third input of said second AND gate; and
    an exclusive-OR gate having an output connected to said set input of said further flip-flop, a first input connected to said output of said first NOT gate and to said second input of said second AND gate, and a second input connected to said output of said third AND gate.

6. The comparator circuit according to claim 1, wherein the threshold value $T_1$, the switch-on threshold $T_2$ and the switch-off threshold $T_3$ are chosen such that $T_3<T_1<T_2$.

7. The comparator circuit according to claim 1, wherein the first logic signal is low, and the second logic signal is high.

* * * * *

UNITED STATES PATENT AND TRADEMARK OFFICE
CERTIFICATE OF CORRECTION

PATENT NO.    : 6,404,242 B2  
DATED         : June 11, 2002  
INVENTOR(S)   : Dieter Draxelmayr It is certified that error appears in the above-identified patent and that said Letters Patent is hereby corrected as shown below:

<u>Title page,</u>
Item [30], should read as follows:

-- Foreign Application Priority Data

Feb. 8, 1999       (DE) ....................199 05 053.8 --

Signed and Sealed this

Twenty-sixth Day of November, 2002

*Attest:*

*Attesting Officer*

JAMES E. ROGAN
*Director of the United States Patent and Trademark Office*